US006420930B1

(12) United States Patent
Takagishi

(10) Patent No.: US 6,420,930 B1
(45) Date of Patent: Jul. 16, 2002

(54) CLASS D AUDIO AMPLIFIER

(75) Inventor: Hideto Takagishi, San Jose, CA (US)

(73) Assignee: Monolithic Power Systems, Inc., Santa Clara, CA (US)

( * ) Notice: Subject to any disclaimer, the term of this patent is extended or adjusted under 35 U.S.C. 154(b) by 0 days.

(21) Appl. No.: 09/614,410

(22) Filed: Jul. 12, 2000

(51) Int. Cl.[7] .............................................. H03F 3/217
(52) U.S. Cl. .................................. 330/251; 330/207 A
(58) Field of Search .............................. 330/10, 207 A, 330/251

(56) References Cited

U.S. PATENT DOCUMENTS

| 3,636,380 A | | 1/1972 | Anderson |
| 4,531,096 A | | 7/1985 | Yokoyama |
| 5,077,540 A | | 12/1991 | Keith et al. |
| 5,218,315 A | | 6/1993 | Turner |
| 5,777,512 A | | 7/1998 | Tripathi et al. |
| 5,838,193 A | * | 11/1998 | Myers et al. ............... 330/10 |
| 5,929,776 A | | 7/1999 | Warble et al. |
| 5,973,368 A | | 10/1999 | Pearce et al. |
| 5,986,498 A | * | 11/1999 | Rodriguez ................. 330/10 |
| 6,229,393 B1 | * | 5/2001 | Daners .................... 330/251 |
| 6,297,693 B1 | | 10/2001 | Pullen |

FOREIGN PATENT DOCUMENTS

| WO | WO 99/08378 | 2/1999 |
| WO | WO 00/42702 | 7/2000 |

* cited by examiner

*Primary Examiner*—Steven J. Mottola
(74) *Attorney, Agent, or Firm*—Perkins Coie LLP

(57) ABSTRACT

A Class D amplifier circuit performs audio signal processing and other signal processing by using a bang-bang controller and a noise-shaping feedback network. The bang-bang controller triggers generation of a rectangular waveform that corresponds to changes in a control signal derived from an input analog signal, with the generation of the rectangular waveform being based on a comparison of the control signal with another signal derived from hysteresis associated with an output of a comparator. A filter filters the rectangular waveform to obtain an amplified output analog signal substantially representative of the input analog signal. The feedback network noise shapes the output analog signal, and feeds back the noise-shaped output analog signal and substracts it from the input analog signal.

19 Claims, 2 Drawing Sheets

CLASS D AUDIO AMPLIFIER

BACKGROUND OF THE INVENTION

1. Field of the Invention

The present invention relates generally to audio signal processing, and in particular, relates to a system that includes a Class D amplifier for audio signal amplification and other audio signal processing.

2. Background Information

Class D amplifiers are often used for audio amplification because of their power efficiency. They provide substantially full output power, while minimizing internal power consumption. Typically, a Class D amplifier is operated in switch mode, where its output stage produces a rectangular wave that is filtered before delivery to a load, such as a loudspeaker. The rectangular wave varies according to an input analog signal, and when the rectangular wave is filtered at the output, the resulting waveform is an amplified version of the input analog signal.

Two main techniques dominate the implementation of Class D audio power amplifiers. A first technique, pulse width modulation (PWM), drives the output stage at a constant carrier frequency and modulates the duty cycle of its pulses. In an analog approach, a differential analog comparator has the input analog signal at one input and a triangle waveform at another input. The triangle waveform oscillates at the carrier frequency, and the output stage is switched every time the triangle waveform crosses the instantaneous value of the input analog signal. This switching results in output pulses having pulse widths that correspond to the value of the input analog signal.

A second technique, pulse density modulation (PDM), sometimes referred to as "delta-sigma modulation," uses a decision block that is clocked at a constant frequency. On every clock edge, the block decides whether the output stage should remain in the present state or change to the opposite state. The idea is that the output of the Class D amplifier is a stream of pulses whose widths vary by quantum increments in time. The time quantum is determined by the frequency of the clock driving the decision block.

There are several problems and drawbacks to Class D amplifier implementations that use PWM, PDM, or other techniques. First, the non-ideal nature of components of Class D amplifiers introduces distortion at the switch output node (e.g., at the output of the Class D amplifier's output stage). Existing methods that attempt to account for this distortion are often unreliable or cumbersome.

Next, signal processing blocks for both PWM and PDM implementations are very complex and costly compared to the output stage or compared to Class AB or Class B analog power amplifiers. For example, a PWM implementation has to generate/use a triangle waveform, and a PDM implementation has to use a clocking mechanism.

Furthermore, because a delta-sigma PDM amplifier is implemented with a sampled (clocked) comparator, the clock rate limits the response time of a feedback loop. That is, once the comparator makes a comparison, another comparison cannot be made until the next clock edge. Similarly, the PWM amplifier makes decisions only when the input signal and the triangular waveform coincide.

Accordingly, improvements are needed in Class D audio amplifiers.

BRIEF DESCRIPTION OF THE DRAWINGS

Non-limiting and non-exhaustive embodiments of the present invention are described in the following figures, wherein like reference numerals and labels refer to like parts throughout the various views, unless otherwise specified.

DETAILED DESCRIPTION

Embodiments of a system and method that uses a Class D amplifier and accompanying circuitry for audio signal amplification and other audio signal processing is described in detail herein. In the following description, some specific details, such as example values for the circuit components, are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
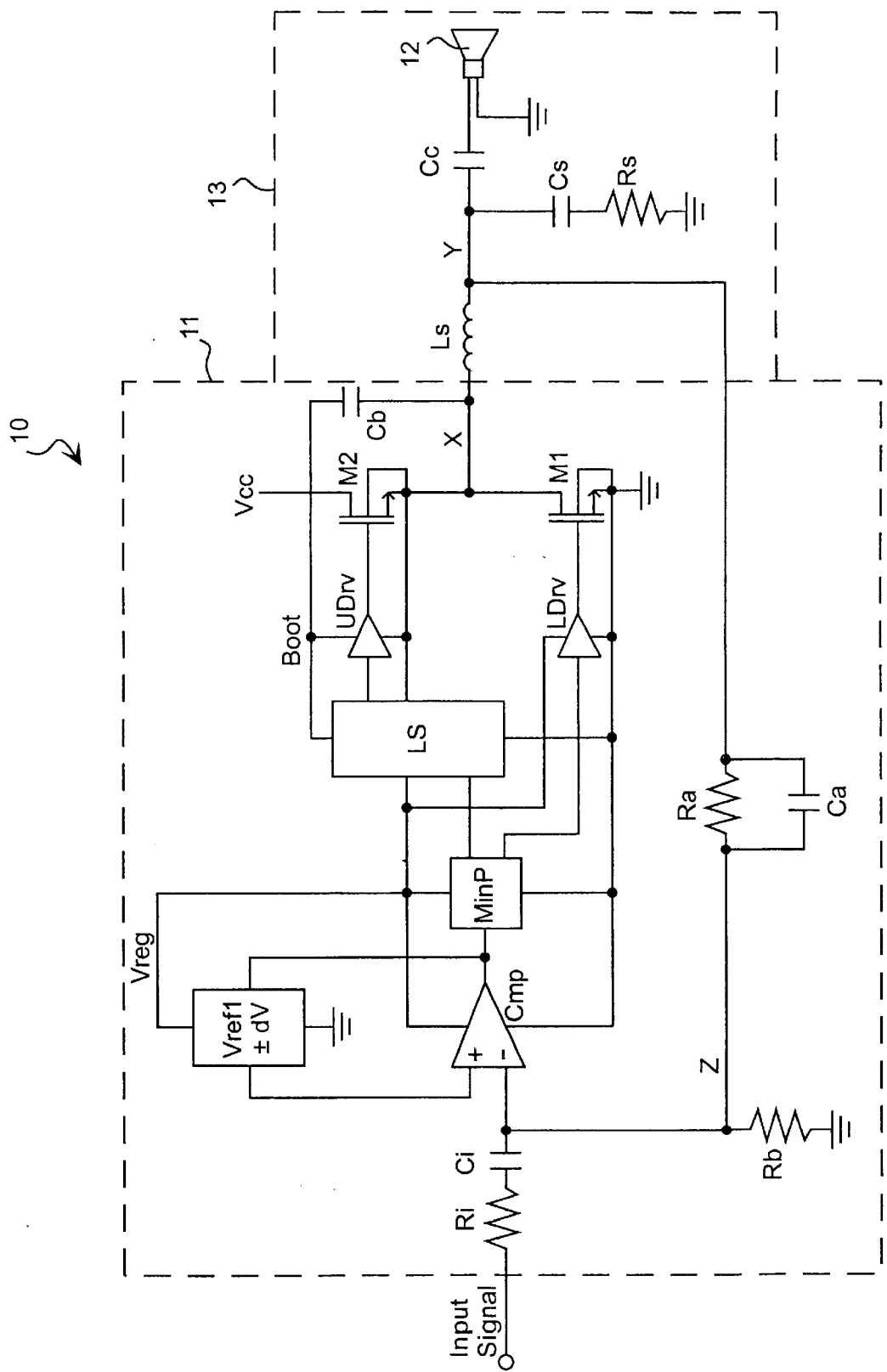
FIG. 1 is a circuit schematic showing an embodiment of a system having a Class D amplifier and other components that are useable for audio signal amplification and other audio signal processing.

Shown generally at 10 in FIG. 1 is an embodiment of a system according to the invention. The system 10 comprises a Class D amplifier circuit 11 and a load 13. The system 10 includes a pair of transistors M1 and M2 that serve as power output switching devices that drive an output switching node X. In one embodiment, the transistors M1 and M2 can be N-channel or P-channel metal oxide semiconductor field effect transistors (MOSFETs) or N-channel junction field effect transistors (JFETs). In another embodiment, bipolar junction transistors (BJTs) may be used. It is to be appreciated that the transistors M1 and M2 may comprise any type of suitable switching device, such that in operation, one switching device is ON while the other switching device is OFF.

The transistor M2 has its source terminal coupled to the node X, while the transistor M1 has its source terminal coupled to ground. A drain of the transistor M2 is connected to a power supply Vcc, which may be 22 volts in one embodiment, for example, while a drain of the transistor M1 is coupled to the node X. The transistor M1 and the transistor M2 function as switches that form part of an output stage for the Class D amplifier circuit 11 to produce a rectangular waveform output at the node X, when the output stage is used in a switch mode. Cross-conduction of the output stage is minimized or eliminated by conventional logic (not shown) in the Class D amplifier circuit 11. That is, such logic circuitry verifies that the transistor M2 is OFF before the transistor M1 turns ON, and vice versa.

The rectangular waveform at the node X is filtered by an inductor Ls, a capacitor Cs, and a resistor Rs coupled to ground, and then delivered to an output node Y, all of which comprise the load 13. The load 13 further includes a loudspeaker 12 capacitively coupled to the node Y by a capacitor Cc. Example values for these various circuit components in one embodiment can be: Ls=58 μH, Cs=4.7 μF, Rs=0.47 Ohms, and Cc=1000 μF, and it is understood that other embodiments may utilize components having different values.

The signal at the node Y is fed back (negative feedback) to a summing node Z, via a network having a resistor Ra and a capacitor Ca connected in parallel, and a grounded resistor Rb. An input signal (e.g., an analog audio signal) is coupled to the node Z through a resistor Ri and an input coupling capacitor Ci. The resistor Ri provides input resistance, and the capacitor Ci blocks direct current (DC) components of the input signal. Example values for these circuit components in one embodiment can be: Ra=90 k Ohms, Ca=470 pF, Rb=20 k Ohms, Ri=5 k Ohms, and Ci=1 μF, and again, it is understood that other embodiments may utilize components having different values.

The node Z is coupled to (or monitored by) an inverting input of a comparator Cmp, which forms part of an input stage for the Class D amplifier circuit 11. A non-inverting input of the comparator Cmp is biased to a reference voltage Vref, which in one embodiment can be 2 volts±a small voltage dV that is coupled to and dependent on an output level of the comparator Cmp. The small voltage dV represents a local hysteresis that causes the comparator Cmp to switch crisply. Hence, the comparator Cmp and the Vref and dV voltages cooperate to form what is commonly referred to as a "bang-bang controller."

It is also possible to configure the class D amplifier circuit as a non-inverting amplifier. An example of such an embodiment is shown as a class D amplifier circuit 18 in a system 20 of FIG. 2. In this case, the input signal is fed into the non-inverting input node of the comparator Cmp, through a resistor Rc and a capacitor Cd, and the inverting input is grounded. A resistor Rd is coupled between the reference voltage Vref and the non-inverting input node of the comparator Cmp. Suitable values for the resistors Rc and Rd and the capacitor Cd would be known by those skilled in the art based on the description of the embodiments provided herein. With the class D amplifier circuit 18, when a positive input signal is received at the non-inverting terminal, the output signal at the node Y is an amplified in-phase (e.g., not inverted) signal.

Referring back to FIG. 1, the output of the comparator Cmp drives a minimum pulse block MinP that limits the minimum pulse width of the signals that are output from the comparator Cmp. In one embodiment, the block MinP can time the minimum pulse widths at 1 μs, for example. The block MinP has two outputs having opposite logic states (e.g., if one output is a binary 1, the other output is a binary 0). One output of the block MinP drives an upper driver Udrv through a level-shift circuit LS, and the other output of the block MinP drives a lower driver LDrv directly. Examples of specific circuitry for the block MinP and the level-shift circuit LS are not described in detail herein because they are known in the art.

An output of the lower driver LDrv drives the gate of the transistor M1, and an output of the upper driver UDrv drives the gate of the transistor M2. The upper driver UDrv is biased by a floating power supply connected between the node X and a node Boot. According to one embodiment, a capacitor Cb (having a value of 22 nF, for example) provides the floating power supply voltage while the transistor M2 is on. This is similar to a conventional bootstrap drive technique that enables the gate of the transistor M2 to be driven above a positive power supply rail (e.g., above the supply voltage Vcc).

The capacitor Cb can be charged from a regulated power supply Vreg through a diode (not shown) while the node X is low. The regulated power supply Vreg can also bias the comparator Cmp, the block MinP, part of the level-shift circuit LS, the lower driver LDrv, and other circuitry (not shown). An example value in one embodiment for the regulated power supply Vreg is 5 volts, and it is understood that different values for Vreg may be suitable for other embodiments.

A quiescent output level V(Y) at the node Y is set by the resistors Ra and Rb according to the following equation:

$$V(Y)=Vref*(1+Ra/Rb) \tag{1}$$

Thus, in one embodiment, if Vcc is 22 volts, the signal at the node X will transition between 0 volts and 22 volts, while the node Y will be at V(Y)=11 volts.

A mid-band gain Av (absolute value) of the Class D amplifier circuit 11 is set by the resistors Ra and Ri according to the following equation:

$$Av=Ra/Ri \tag{2}$$

The Class D amplifier circuit 11 produces an amplified, inverted version of the input signal at the node Y (e.g., Av is negative).

A turn-over frequency ft is set by the capacitor Ci and the resistor Ri according to the following equation:

$$ft=1/(2*\pi*Ri*Ci) \tag{3}$$

Noise feedback is shaped by the resistor Rs and the capacitor Ca. More specifically, the resistor Rs and the capacitor Ca help to reduce aliasing caused by high frequency (out-of-band) noise that folds into the band(s) of interest (e.g., noise that folds into the audio band). Both the resistor Rs and the capacitor Ca provide the control loop with some lead compensation by feeding back the output signal from the node Y that has had noise at high frequencies accentuated, thereby compensating for or reducing any distortion or noise at the audio band that results from minor variations in output device characteristics, as well as improving overall loop stability and response time.

Operation of the system 10 is as follows. The input signal at the node Z of the comparator Cmp is compared to Vref±dV. In effect, the output of the comparator Cmp thus depends on the input voltage and on its recent history (e.g., the hysteresis). The output of the comparator Cmp, as a result, is a rectangular waveform that transitions between binary 0 and binary 1 levels. For example, the comparator Cmp outputs a substantially DC binary 1 signal as the input signal steadily increases in magnitude. As the input signal steadily decreases in magnitude, the comparator Cmp outputs a substantially DC binary 0 signal. The output of the comparator Cmp transitions between binary 0 and binary 1 (and vice versa) whenever the difference (e.g., a control signal) between the input signal and the node Y output signal (scaled) changes (e.g., whenever the amplitude of the input signal begins increasing or begins decreasing), with the comparison being based on the hysteresis. Accordingly, the "length" of the binary 1 and binary 0 pulse widths of the output signal of the comparator Cmp provides a representation of the control signal.

This rectangular wave output signal of the comparator Cmp is fed into the block MinP. As described above, the block MinP has two outputs at simultaneously different logic states. Hence, the rectangular wave output signal of the comparator Cmp causes the block MinP to drive the upper driver UDrv the and lower driver LDrv to turn ON/OFF the transistors M2 and M1 respectively. As a result of the switching action of the transistors M1 and M2, a rectangular wave is generated at the node X that is an amplified version of the rectangular wave generated at the output of the comparator Cmp. In an embodiment, if the supply voltage Vcc is at 22 volts, the rectangular wave at the node X transitions between 22 volts and 0 volts (e.g., the rectangular wave "bangs" between 22 volts and 0 volts).

Figure 2:
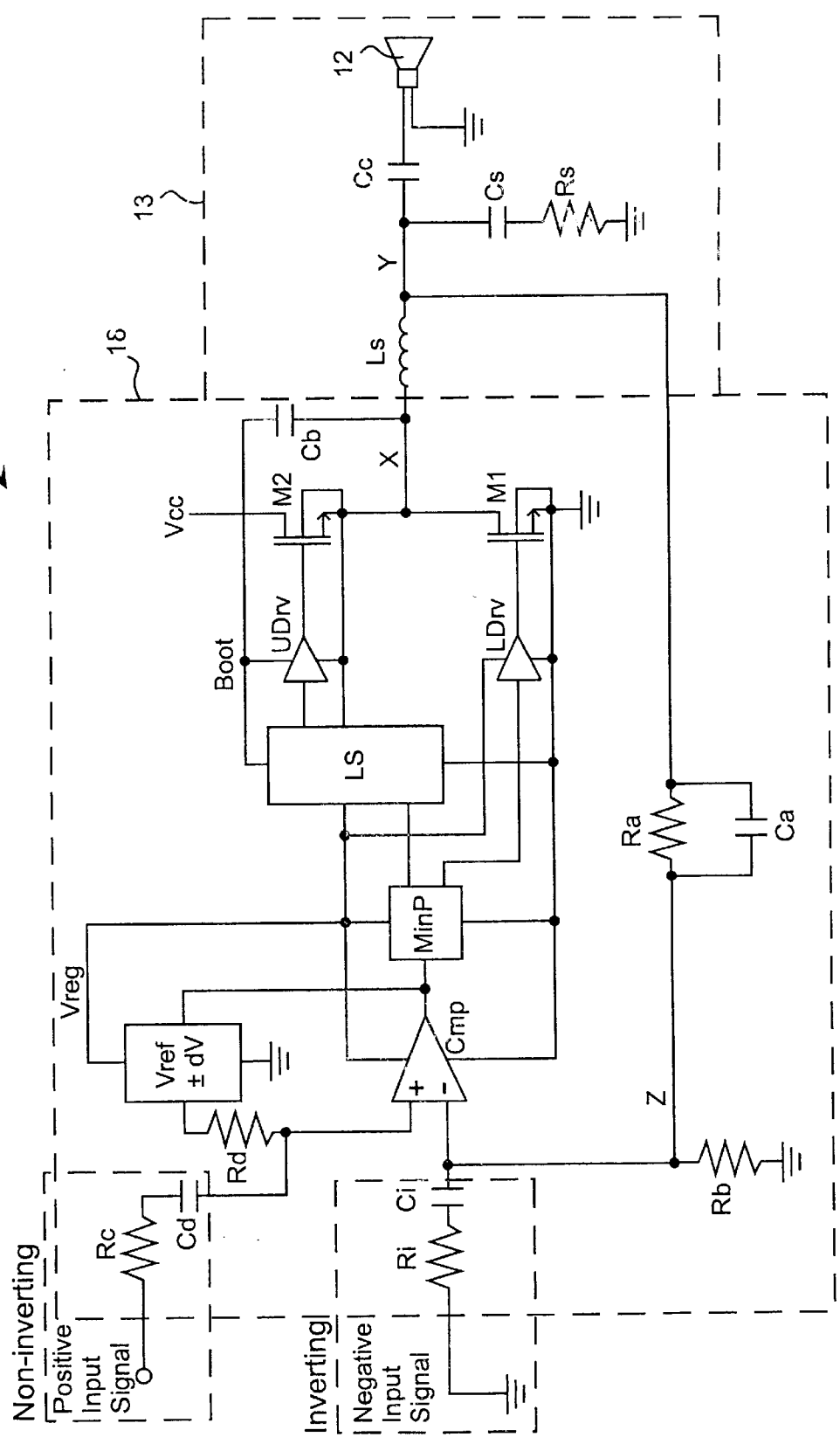
FIG. 2 is a circuit schematic showing another embodiment of a system having a class D amplifier and other components that are useable for audio signal amplification and other audio signal processing.

Next, the rectangular wave at the node X is filtered by the inductor Ls, the capacitor Cs, and the resistor Rs. More specifically, because the current through the inductor Ls and the voltage across the capacitor Cs do not change instantaneously, these components at the load 13 provide a filter that "smooths" the rectangular wave coming from the node X. As a result, an analog output signal is provided to the loudspeaker 12 that is an inverted, amplified version of the input signal, if an inverting configuration, such as that shown in FIG. 1, is used. The analog output signal is not inverted (e.g., is in phase) if the non-inverting configuration, such as that shown in FIG. 2, is used.

The above-described operation of the system 10 can be thought of as an "analog adaptive modulation" (AAM) implementation of a Class D power amplifier. AAM allows implementation of a simple signal processing block on the same die as the output stage with low distortion and quick response time, and is derived from the bang-bang controller theory. The only feedback path is from the output node Y. This ensures good control of the major source of distortion (the output stage switching waveform at the node X) and also controls distortion due to variations in load impedance. As described above, the feedback network is configured to shape the output noise spectrum and to minimize noise contamination in the audio band. This shaped feedback signal is subtracted from the input signal at a pseudo-summing node (e.g., at the node Z). The comparator Cmp is a real-time comparator, with a small amount of hysteresis, that monitors the node Z.

One advantage of the AAM over PDM implementations is that the comparator Cmp is not clocked and is therefore free to respond to changes in the input signal immediately, based on a comparison of the input signal with hysteresis. This maximizes control bandwidth and minimizes response time.

Another advantage of AAM is that it is very simple compared to existing PWM and PDM implementations. The signal processing block comprises the comparator Cmp and the block MinP to provide timing. These functions are simple enough that they can be economically implemented on the same die as the power output stage. A separate triangle waveform, such as that used for PWM, is not required with AAM.

Also, with AAM, the output stage makes a transition only as often as is necessary to control the trajectory of the output node voltage at the node Y. That is, the rectangular waveform at the node X transitions from high to low (and vice versa) only in response to changes in the trajectory of the control signal. Fewer edges at the switch output node X means less switching loss in the output stage (e.g., there is less switching by the transistors M1 and M2), which further improves the efficiency of the Class D amplifier circuits 11 and 18.

Furthermore, AAM advantageously spreads the spectrum of the signal at the output switching node X in much the same manner as PDM.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

For instance, while specific component values and voltage supply values are provided herein, it is to be appreciated that these values are for the sake of illustration and explanation. Various embodiments of the invention may utilize values that are different from what is specified herein.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
   introducing a control signal to an input stage;
   using a bang-bang controller at the input stage to trigger generation of a first signal representative of the control signal, wherein using the bang-bang controller to trigger generation of the first signal comprises:
      comparing the control signal with a signal derived from a hysteresis associated with the first signal; and
      changing a state of the first signal based on the comparison, the change in state of the first signal indicative of a change in value of the control signal;
   using the first signal to drive an output stage to generate a second signal; and
   filtering the second signal generated by the output stage to obtain an amplified output signal substantially representative of an input signal from which the control signal is derived.

2. The method of claim 1, further comprising:
   noise shaping the output signal; and
   feeding the noise-shaped output signal back to the input stage and subtracting the feedback noise-shaped output signal from the input signal.

3. The method of claim 2 wherein noise shaping the output signal comprises accentuating high-frequency noise components by using a resistor from a filter that filters the second signal and a capacitor in a feedback network that feeds the output signal back to the input stage.

4. The method of claim 1 wherein the input signal and output signal comprise continuous-time analog signals, and wherein the first and second signals comprise substantially rectangular waveforms.

5. The method of claim 1 wherein using the first signal to drive the output stage to generate the second signal comprises selectively and alternately activating a pair of switching devices based on states of the first signal.

6. An apparatus, comprising:
   an input stage to receive a control signal, the input stage including a bang-bang controller to trigger generation of a first signal representative of the control signal, wherein the bang-bang controller is coupled to:
      compare the control signal with a signal derived from a hysteresis associated with the first signal; and
      change a state of the first signal based on the comparison, the change in state of the first signal indicative of a change in value of the control signal;

an output stage coupled to the input stage and responsive to the first signal to generate a second signal; and a filter coupled to an output node of the output stage to filter the second signal to obtain an amplified output signal substantially representative of an input signal from which the control signal is derived.

7. The apparatus of claim 6 wherein the input stage comprises an amplifier having an inverting configuration.

8. The apparatus of claim 6, further comprising a feedback network coupled between an output node of the filter and an input node of the input stage, the feedback network being capable to noise shape the output signal and to feed the noise-shaped output signal back to the input stage to subtract the noise-shaped output signal from the input signal.

9. The apparatus of claim 8 wherein the feedback network includes a resistor and capacitor connected in parallel, the capacitor being capable to cooperate, with a resistor of the filter to noise shape the output signal.

10. The apparatus of claim 6 wherein the input stage includes a comparator having a signal associated with the control signal at an inverting input and a signal derived from the hysteresis associated with the first signal at a non-inverting input.

11. The apparatus of claim 6 wherein the output stage comprises:

a minimum pulse width block to receive the first signal from the input stage and to output third and fourth signals having opposite states, the minimum pulse width block capable of sending the third signal to a first driver;

a level-shift circuit to receive the fourth signal from the minimum pulse width block and having an output node coupled to a second driver; and first and second transistors coupled to and responsive to the first and second drivers, respectively, the first and second transistors capable of alternately activating and deactivating to generate the second signal, based on the third and fourth signals respectively received by the first and second drivers.

12. The apparatus of claim 11 wherein the second driver is biased by a floating power supply connected between the output node of the output stage and a node of the second driver.

13. The apparatus of claim 12 wherein the floating power supply comprises a capacitor that is charged if the second transistor is activated.

14. The apparatus of claim 6, further comprising a load coupled to the filter to receive the amplified output signal.

15. The apparatus of claim 6 wherein the input signal and output signal comprise continuous-time analog signals, and wherein the first and second signals comprise substantially rectangular waveforms.

16. The apparatus of claim 6 wherein the input stage comprises an amplifier having a non-inverting configuration.

17. An apparatus, comprising:

an input stage to receive a control signal, the input stage including a bang-bang controller to trigger generation of a first signal representative of the control signal, wherein the bang-bang controller is coupled to:

compare the control signal with a signal derived from a hysteresis associated with the first signal; and change a state of the first signal based on the comparison, the change in state of the first signal indicative of a change in value of the control signal; and an output stage coupled to the input stage and responsive to the first signal to generate a second signal that can be filtered to obtain an amplified output signal substantially representative of an input signal from which the control signal is derived.

18. The apparatus of claim 17, further comprising a filter coupled to an output node of the output stage to filter the second signal to obtain the amplified output signal substantially representative of the input signal from which the control signal is derived.

19. The apparatus of claim 17, further comprising a feedback network coupled between an output node of the filter and an input node of the input stage, the feedback network being capable to noise shape the output signal and to feed the noise-shaped output signal back to the input stage to subtract the noise-shaped output signal from the input signal, wherein the feedback network includes a resistor and capacitor connected in parallel, the capacitor being capable to cooperate with a resistor of the filter to noise shape the output signal.

* * * * *

UNITED STATES PATENT AND TRADEMARK OFFICE
CERTIFICATE OF CORRECTION

PATENT NO. : 6,420,930 B1
DATED : July 16, 2002
INVENTOR(S) : Takagishi

It is certified that error appears in the above-identified patent and that said Letters Patent is hereby corrected as shown below:

<u>Column 7,</u>
Line 17, delete comma between "cooperate" and "with";

Signed and Sealed this

Seventeenth Day of September, 2002

*Attest:*

*Attesting Officer*

JAMES E. ROGAN
*Director of the United States Patent and Trademark Office*